(12) United States Patent
Sonoda et al.

(10) Patent No.: US 9,653,703 B2
(45) Date of Patent: May 16, 2017

(54) ELECTROLUMINESCENT DEVICE INCLUDING A PROTECTIVE FILM BETWEEN AN ELECTROLUMINESCENT ELEMENT AND A DESICCANT LAYER

(71) Applicant: Sharp Kabushiki Kaisha, Osaka-shi, Osaka (JP)

(72) Inventors: Tohru Sonoda, Osaka (JP); Takeshi Hirase, Osaka (JP); Tetsuya Okamoto, Osaka (JP); Tohru Senoo, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 14/760,234

(22) PCT Filed: Jan. 31, 2014

(86) PCT No.: PCT/JP2014/052240
§ 371 (c)(1),
(2) Date: Jul. 10, 2015

(87) PCT Pub. No.: WO2014/123067
PCT Pub. Date: Aug. 14, 2014

(65) Prior Publication Data
US 2015/0357600 A1    Dec. 10, 2015

(30) Foreign Application Priority Data
Feb. 8, 2013    (JP) ................. 2013-023244

(51) Int. Cl.
*H01L 51/52*    (2006.01)
*H05B 33/04*    (2006.01)
*H01L 27/32*    (2006.01)

(52) U.S. Cl.
CPC ...... *H01L 51/5259* (2013.01); *H01L 51/5246* (2013.01); *H01L 51/5284* (2013.01); *H05B 33/04* (2013.01); *H01L 27/322* (2013.01)

(58) Field of Classification Search
None
See application file for complete search history.

(56) References Cited

U.S. PATENT DOCUMENTS

2012/0206036 A1\* 8/2012 Tanaka ................ H01L 27/3204
313/504

FOREIGN PATENT DOCUMENTS

| JP | 2005-174557 A | 6/2005 |
| JP | 2006-338946 A | 12/2006 |
| JP | 2006338946 A * | 12/2006 |

OTHER PUBLICATIONS

Official Communication issued in International Patent Application No. PCT/JP2014/052240, mailed on Apr. 15, 2014.

* cited by examiner

Primary Examiner — Daniel Whalen
(74) Attorney, Agent, or Firm — Keating & Bennett, LLP

(57) ABSTRACT

In an organic EL display device (electroluminescent device) equipped with an organic EL element (electroluminescent element), the organic EL element is encapsulated by a TFT substrate (substrate), a counter substrate, and a sealing resin. A desiccant layer and a highly-moisture-permeable layer are laminated in this order on the organic EL element. The highly-moisture-permeable layer is in direct contact with the sealing resin.

9 Claims, 9 Drawing Sheets

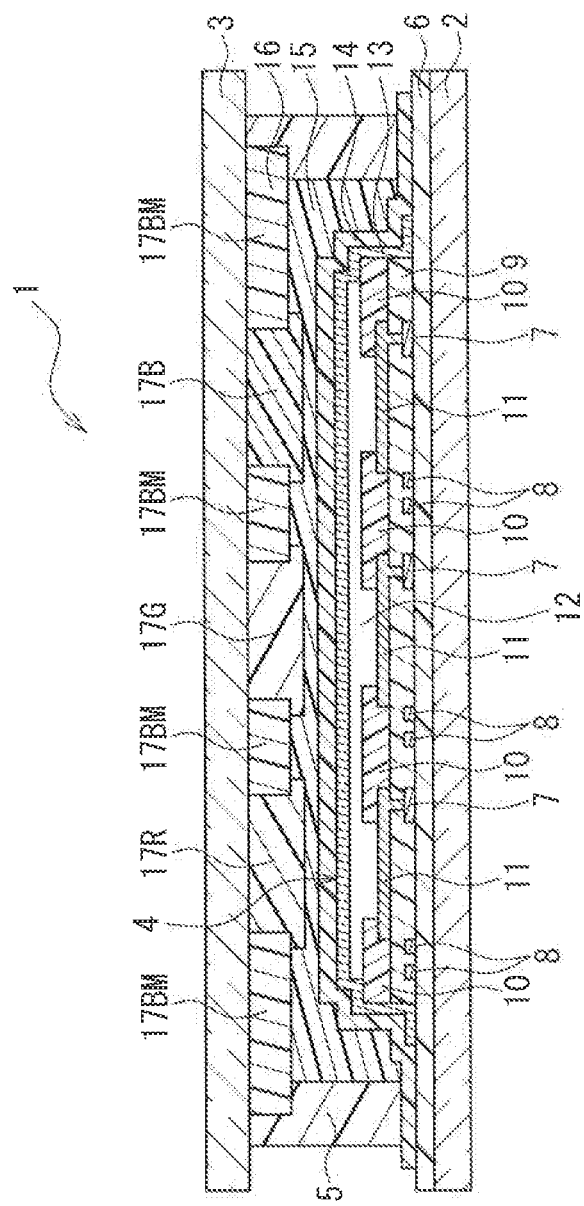
F I G. 5

(a)

(b)

ELECTROLUMINESCENT DEVICE INCLUDING A PROTECTIVE FILM BETWEEN AN ELECTROLUMINESCENT ELEMENT AND A DESICCANT LAYER

TECHNICAL FIELD

The present invention relates to an electroluminescent device having an EL (electroluminescent) element.

BACKGROUND ART

In recent years, flat panel displays are used in various commodity products and fields, and thus flat panel displays are required to have a large size, high image quality and low power consumption.

Under the circumstances, organic EL display devices, which include an organic EL (electroluminescent) element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a fluorescent layer are laminated between a pair of electrodes. The TFT is connected to one of the pair of electrodes. Then, voltage is applied across the pair of electrodes so as to cause the fluorescent layer to emit light, whereby an image is displayed.

In the above-described organic EL display device, the organic EL element may deteriorate due to external moisture. Therefore, in order to prevent deterioration caused by the moisture, in a conventional organic EL display device, it has been proposed to form a low-moisture-permeable sealing resin around the organic EL element and filling the interior with a desiccant (a getter) by DAM & FILL process.

However, in the conventional organic EL display device, at the pixels in the vicinity of the periphery, damage to the luminescence property caused by moisture proceeds or cracking occurs in the desiccant layer in the vicinity of the periphery before the desiccant layer reaches its total moisture absorption amount, which may cause damage to the pixels and degradation in the display quality.

Specifically, in this conventional organic EL display device, moisture that has passed through the sealing resin is absorbed by the desiccant layer. However, since the moisture is absorbed before diffusing sufficiently into the desiccant layer, partial moisture absorption proceeds preferentially in the vicinity of the periphery rather than in the internal region. As a result, a part in the vicinity of the periphery of the desiccant layer reaches formerly its saturation of moisture absorption, and thus entrance of moisture into the pixels in the vicinity of the periphery cannot be suppressed, which may result in damage to the luminescence property. Further, as a result of moisture absorption, the desiccant layer is cured and shrunk. However, since the cure shrinkage proceeds only partially in the vicinity of periphery, sometimes the desiccant layer is distorted and cracked. The cracks in the desiccant layer affect the optical properties of the organic EL display device. Moreover, when the layer composing the pixels of the organic EL display device is affected by the above-described cracks, it may do damage to the luminescence property of the pixel.

Therefore, as described in Patent document 1 below for example, it is proposed in a conventional organic EL display device to interlay a first resin layer between a desiccant layer and an organic EL element, and the first resin layer has a moisture permeation higher than a moisture permeation of a second resin layer (sealing resin). Further, it is also proposed in this conventional organic EL display device that a first moisture-proof layer having a moisture permeation lower than that of the first resin layer is interlaid between the first resin layer and the organic EL element, and that a second moisture-proof layer having a moisture permeation lower than that of the first resin layer is interlaid between the desiccant layer and the first resin layer. Namely, in this conventional organic EL display device, the first moisture-proof layer is provided on the organic EL element, and the first resin layer is provided in the inner face of the second resin layer, and the second moisture-proof layer and the desiccant layer are laminated in this order within this first resin layer, and this first resin layer is provided on the first moisture-proof layer.

In this conventional organic EL display device, moisture that enters from the exterior into the second resin layer is not partialized in the periphery of the second resin layer but it diffuses within the entire first resin layer. And thus, it has been regarded that partial moisture absorption in the desiccant layer is suppressed and the moisture can be absorbed uniformly in the entire desiccant layer. Further in this conventional organic EL display device, the moisture that entered the first resin layer can be directed to the desiccant layer side preferentially rather than the organic EL element side, and thus, it is regarded as possible to be absorbed preferentially by the desiccant layer. In addition, in this conventional organic EL display device, after moisture has entered the first resin layer, the second moisture-proof layer can suppress immediate absorption of the moisture by the desiccant layer, and the moisture that has entered the first resin layer can diffuse without partiality in the entire first resin layer. It is regarded as a result that the moisture is absorbed uniformly by the entire desiccant layer, thereby preventing a partial moisture absorption by the desiccant layer.

PRIOR ART DOCUMENTS

Patent Documents

Patent document 1: JP 2005-174557 A

DISCLOSURE OF INVENTION

Problem to be Solved by the Invention

However, in the above-described conventional organic EL display device (electroluminescent device), the organic EL element and the desiccant layer are disposed in a state separated from each other via the first moisture-proof layer, the first resin layer, and the second moisture-proof layer. Therefore, in this conventional organic EL display device, a part of moisture that has permeated the second resin layer (sealing resin) and has not diffused toward the first resin layer sometimes diffuses directly within the first moisture-proof layer, and reaches the organic EL element without being absorbed by the desiccant layer. Further in this conventional organic EL display device, even the moisture that has diffused in the first resin layer may reach the organic EL element if the moisture diffuses again in the first moisture-proof layer located opposite to the desiccant layer. Furthermore, since in this conventional organic EL display device, the first moisture-proof layer, the first resin layer, the second moisture-proof layer and the desiccant layer are laminated in this order on the organic EL element, sometimes it is difficult to provide the desiccant layer having a sufficient thickness. In other words, if the desiccant layer has a sufficient thickness, it is necessary to provide the second moisture-proof layer to cover the desiccant layer completely, and formation of the second moisture-proof layer will raise the production cost. Furthermore, due to the total thickness of the desiccant layer and the first resin layer, the distance (cell gap) between the substrate on which the organic EL element is formed and the substrate on which the desiccant layer is formed is increased. As a result, the area where the second resin layer is exposed to the outside air is also increased, and thus the amount of the entering moisture is increased to accelerate deterioration of the organic EL element. Therefore, it is difficult to provide the desiccant layer of a sufficient thickness.

In conclusion, this conventional organic EL display device can suppress a partial moisture absorption at the desiccant layer, but the organic EL display device having a thin desiccant layer has a problem, i.e., difficulty in making the moisture be absorbed surely by the desiccant layer.

Therefore, with the foregoing in mind, it is an object of the present invention to provide an electroluminescent device that can make moisture be absorbed surely by the desiccant layer while preventing partial moisture absorption.

Means for Solving Problem

In order to achieve the above-described object, an electroluminescent device according to the present invention is characterized in that it includes a substrate and an electroluminescent element provided on the substrate. In the organic electroluminescent display device, the electroluminescent element is encapsulated by the substrate, a counter substrate provided opposed to the substrate, and a sealing resin interlaid between the substrate and the counter substrate. A desiccant layer and a highly-moisture-permeable layer are laminated in this order on the electroluminescent element, and the highly-moisture-permeable layer is in direct contact with the sealing resin.

In the thus configured electroluminescent device, the electroluminescent element is encapsulated by the substrate, the counter substrate, and the sealing resin. The desiccant layer and the highly-moisture-permeable layer are laminated in this order on the electroluminescent element. The highly-moisture-permeable layer is in direct contact with the sealing resin. Thereby, unlike the above-described conventional example, it is possible to configure an electroluminescent device that can make moisture be absorbed surely by a desiccant layer while preventing partial moisture absorption. Namely, due to the highly-moisture-permeable layer, the moisture that has permeated the sealing resin can diffuse into the entire desiccant layer, thereby preventing partial moisture absorption in the desiccant layer. Further, unlike the above-described conventional example, it is possible to increase easily the thickness of the desiccant layer and improve easily the moisture absorption performance in the desiccant layer. Even if the moisture that has permeated the sealing resin does not diffuse in the highly-moisture-permeable layer, the moisture can be absorbed surely by the desiccant layer. Alternatively even if the moisture diffusing into the highly-moisture-permeable layer diffuses toward the electroluminescent element, the moisture can be absorbed surely by the desiccant layer since the moisture passes necessarily through the desiccant layer.

In the above-described electroluminescent device, the desiccant layer may be provided to fill a space surrounded by the electroluminescent element, the sealing resin and the highly-moisture-permeable layer.

In this case, the moisture absorption performance of the desiccant layer can be improved more easily.

In the above-described electroluminescent device, a hollow region may be formed between the sealing resin and the desiccant layer.

In this case, the hollow region can prevent more surely partial moisture absorption in the desiccant layer, and at the same time, more moisture can be directed toward the highly-moisture-permeable layer.

In the above-described electroluminescent device, it is preferable that the hollow region is set to have a low pressure of not more than 1 Pa, or to be filled with an inactive gas.

In this case, it is possible to provide more appropriately the desiccant layer and the hollow region.

In the above-described electroluminescent device, it is preferable that the highly-moisture-permeable layer is provided to get into the sealing resin.

In this case, it is possible to diffuse the moisture more into the highly-moisture-permeable layer and to prevent more surely partial moisture absorption in the desiccant layer.

In the above-described electroluminescent device, the highly-moisture-permeable layer may be composed of a resin material.

In this case, the highly-moisture-permeable layer can be provided easily.

In the above-described electroluminescent device, a black matrix layer and a color filter layer may be used as the highly-moisture-permeable layer.

In this case, it is possible to configure easily a display device capable of full color display even when the electroluminescent element emits white light.

In the above-described electroluminescent device, the highly-moisture-permeable layer may have a moisture permeation rate greater than a moisture permeation rate of the sealing resin.

In this case, the moisture that has permeated the sealing resin is diffused rapidly by the highly-moisture-permeable layer without retaining at the interface between the sealing resin and the highly-moisture-permeable layer.

Effects of the Invention

According to the present invention, it is possible to provide an electroluminescent device capable of making moisture be absorbed in a desiccant layer while preventing partial moisture absorption.

BRIEF DESCRIPTION OF DRAWINGS

FIGS. 4(a)-4(c) illustrate a series of principal steps for production.

FIG. 5 is a cross-sectional view for illustrating an organic EL display device according to Second Embodiment of the present invention.

DESCRIPTION OF THE INVENTION

Figure 1:
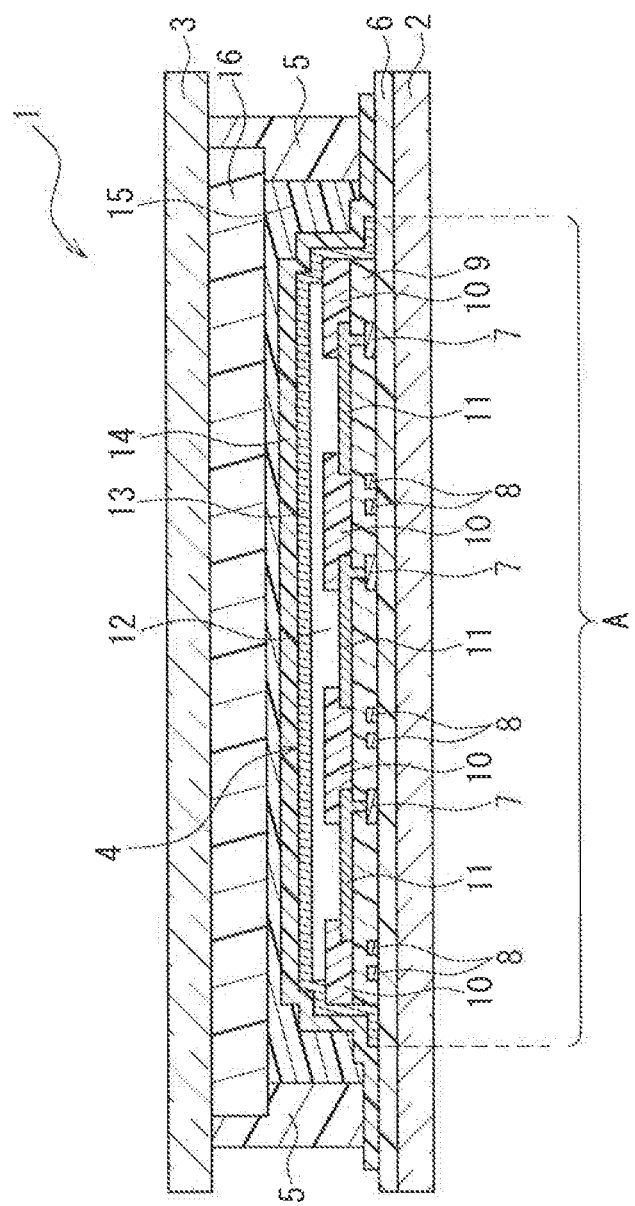
FIG. 1 is a cross-sectional view for illustrating an organic EL display device according to First Embodiment of the present invention.

Hereinafter, preferred embodiments referring to an electroluminescent device of the present invention will be described in detail with reference to attached drawings. In the descriptions below, the present invention is applied to an organic EL display device. The dimensions of constituent members and the dimensional proportions of the members in the drawings are not intended to faithfully represent the actual dimensions of the constituent members and the dimensional proportions of the members.

[First Embodiment]

Figure 2:
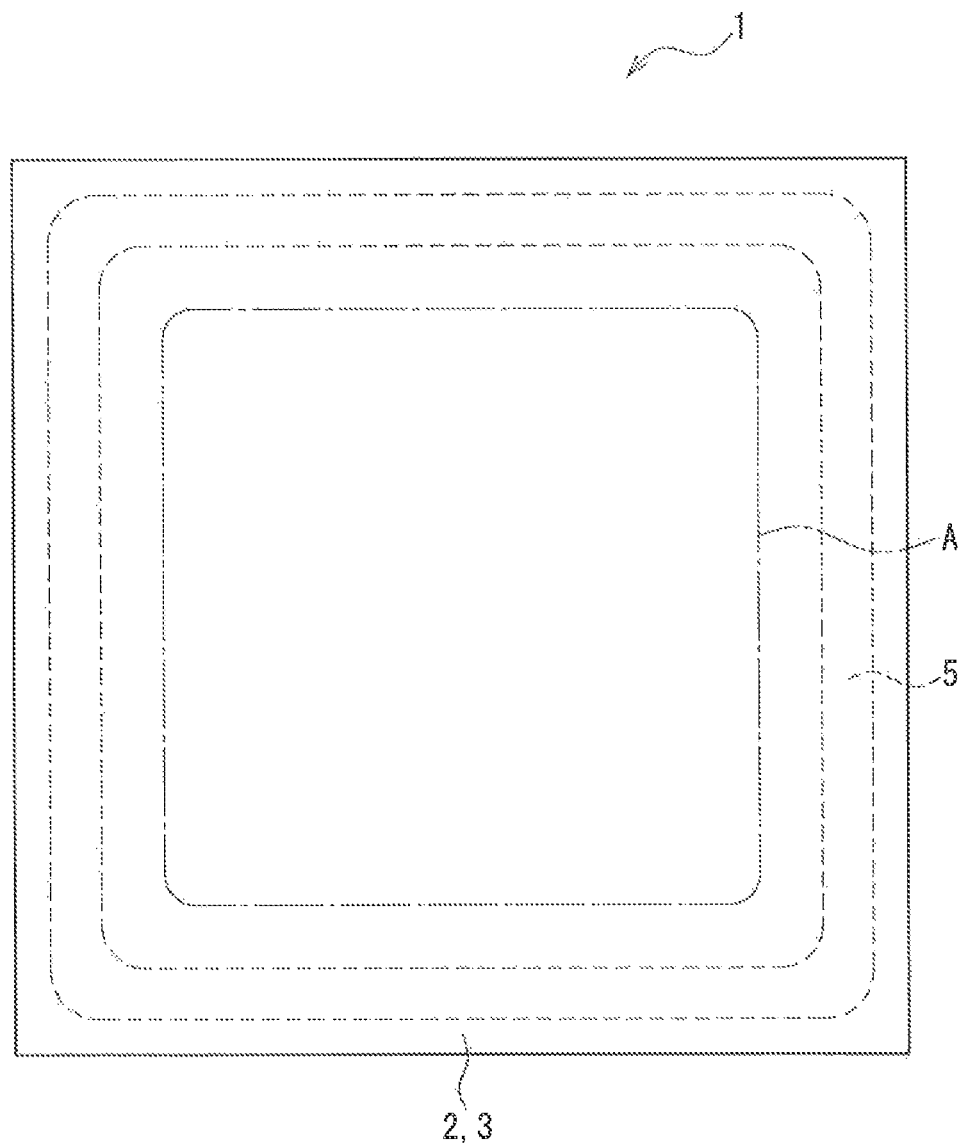
FIG. 2 is a top view of the above-described organic EL display device.

FIG. 1 is a cross-sectional view for illustrating an organic EL display device according to First Embodiment of the present invention. FIG. 2 is a top view of the organic EL display device. In FIG. 1, an organic EL display device 1 of the present embodiment is equipped with a TFT substrate 2 as a substrate, and an organic EL element 4 as an electro luminescent element provided on the TFT substrate 2. The organic EL element 4 is encapsulated by the TFT substrate 2, a counter substrate 3 provided opposite to this TFT substrate 2, and a sealing resin 5 interlaid between the TFT substrate 2 and the counter substrate 3.

In other words, in the organic EL display device 1 of the present embodiment as shown in FIG. 2, the organic EL element 4 composes a pixel region A having a plurality of pixels, and this organic EL element 4 is disposed in a space surrounded by the TFT substrate 2, the counter electrode and the frame-like sealing resin 5. The pixel region A composes also the display part of the organic EL display device 1, and it functions to display information.

Turning to FIG. 1, the TFT substrate 2 and the counter electrode 3 are composed of a glass material for example. The TFT substrate 2 is provided with an underlying film (insulating film) 6 to cover the entire surface, and on this underlying film 6, TFT (thin film transistor) 7 is provided for every pixel in the pixel region A. Further, on the underlying film 6, wirings 8 including a plurality of source lines (signal lines) and a plurality of gate lines arranged in matrix is formed. To the source lines and the gate lines, a source driver and a gate driver are connected respectively (not shown), thereby driving the TFT 7 for each pixel in accordance with a pixel signal inputted from the exterior. Further, the TFT 7 functions as a switching element to control luminescence of corresponding pixels, and thus it controls luminescence at pixels of any color of red (R), green (G), and blue (B) composed of the organic EL element 4.

The underlying film 6 is used to prevent deterioration of the TFT properties due to diffusion of impurities from the TFT substrate 2 to the TFT 7. The underlying film 6 is not required if there is no concern of such deterioration.

On the TFT substrate 2, an interlayer insulating film 9, an edge cover 10, and a first electrode 11 of the organic EL element 4 are formed. The interlayer insulating film 9 functions also as a flattening film, and it is provided on the underlying film 6 so as to cover the TFT 7 and the wirings 8. The edge cover 10 is formed on the interlayer insulating film 9 so as to coat a pattern end of the first electrode 11. The edge cover 10 functions also as an insulating layer to prevent a short circuit between the first electrode 11 and a below-described second electrode 13. Further, the first electrode 11 is connected to the TFT 7 via a contact hole formed in the interlayer insulating film 9.

The opening of the edge cover 10, namely, a part from which the first electrode 11 is exposed substantially composes a luminescent region of the organic EL element 4. As described above, the organic EL display device 1 of the present embodiment is configured to emit light of any color of RGB and to perform a full color display.

On the first electrode 11, an organic EL layer 12 and a second electrode 13 are formed, and the organic EL element 4 is composed of the first electrode 11, the organic EL layer 12 and the second electrode 13. Namely, the organic EL element 4 is a luminescent element capable of a high-intensity luminescence by a low voltage DC drive, and it is formed of the first electrode 11, the organic EL layer 12 and the second electrode 13.

Specifically, in a case where the first electrode 11 is an anode, a hole injection layer, a hole transport layer, a luminescent layer, an electron transport layer, an electron injection layer and the like are laminated as the organic EL layer 12 in this order from the first electrode 11 side (not shown), further a second electrode 13 as a cathode is formed. The configuration is not limited to the above-described example, but a single layer may be formed as a hole injection and transport layer or the like having at least two functions. Alternatively, in the organic EL layer 12, a carrier blocking layer or the like may be inserted appropriately.

On the other hand, in a case where the second electrode 13 is an anode, the order of laminating the layers to form the organic EL layer 12 is diametrically opposed to that described above.

Further in a case where the first electrode 11 is composed of a permeable electrode or a semi-permeable electrode and the second electrode 13 is composed of a reflecting electrode, the organic EL display device 1 is a bottom emission type that emits light from the TFT substrate 2 side. On the contrary, in a case where the first electrode 11 is composed of a reflecting electrode and the second electrode 13 is composed of a permeable electrode or a semi-permeable electrode, the organic EL display device 1 is a top emission type that emits light from the counter electrode 3 side.

In the organic EL display device 1 of the present embodiment, a protective film 14 is formed on the organic EL element 4 in order to prevent damage to the organic EL element 4 during manufacturing a desiccant layer 15 described below and damage to the organic EL element 4 caused by foreign objects, and in order to prevent damage to the organic EL element 4 caused by moisture or oxygen entering from the exterior before formation of the desiccant layer 15. In an alternative configuration, the protective film 14 may not be provided.

As described above, in the organic EL display device 1 of the present embodiment, the organic EL element 4 is encapsulated by the TFT substrate 2, the counter electrode 3 and the sealing resin 5. The sealing resin 5 is composed of a resin such as an epoxy resin including a spacer and inorganic particles dispersed therein.

The spacer defines a cell gap between the TFT substrate 2 and the counter electrode 3. As shown in FIG. 2, the sealing resin 5 is formed like a frame around the pixel region A. The moisture permeability can be decreased further in the sealing resin 5 by dispersing the inorganic particles.

In the organic EL display device 1 of the present embodiment, a desiccant layer 15 and a highly-moisture-permeable layer 16 are laminated in this order on the organic EL element 4 via the protective film 14. The desiccant layer 15 in use includes a metal oxide such as aluminum hydroxide or calcium oxide or activated carbon dispersed in a resin. Further, the desiccant layer 15 is provided to fill the space surrounded by the protective film 14 (organic EL element 4), the sealing resin 5 and the highly-moisture-permeable layer 16, and it traps and absorbs moisture that has permeated the sealing resin 5.

Preferably, the highly-moisture-permeable layer 16 is formed of a material having a moisture permeation rate greater than a moisture permeation rate of the sealing resin 5. Specifically, the highly-moisture-permeable layer 16 is composed of a resin material such as an acrylic resin, a polyimide resin, an epoxy resin, a phenolic resin, polyethylene and the like. Further, in a case where the moisture permeation rate of the sealing resin 5 is 20 g/m²·day for example, it is preferable to set the material and film thickness of the highly-moisture-permeable layer 16 such that the moisture permeation rate will be 100 g/m²·day. Furthermore, in a case where the organic EL display device 1 is the above-described top emission type, preferably the highly-moisture-permeable layer 16 is transparent since light is emitted from the counter substrate 3 side.

The highly-moisture-permeable layer 16 is provided directly on the desiccant layer 15 so as to cover the surface of the desiccant layer 15 facing the counter substrate 3, and the highly-moisture-permeable layer 16 is provided such that its edge will be in direct contact with the sealing resin 5. Furthermore, the highly-moisture-permeable layer 16 is provided to get into the sealing resin 5.

Figure 3:
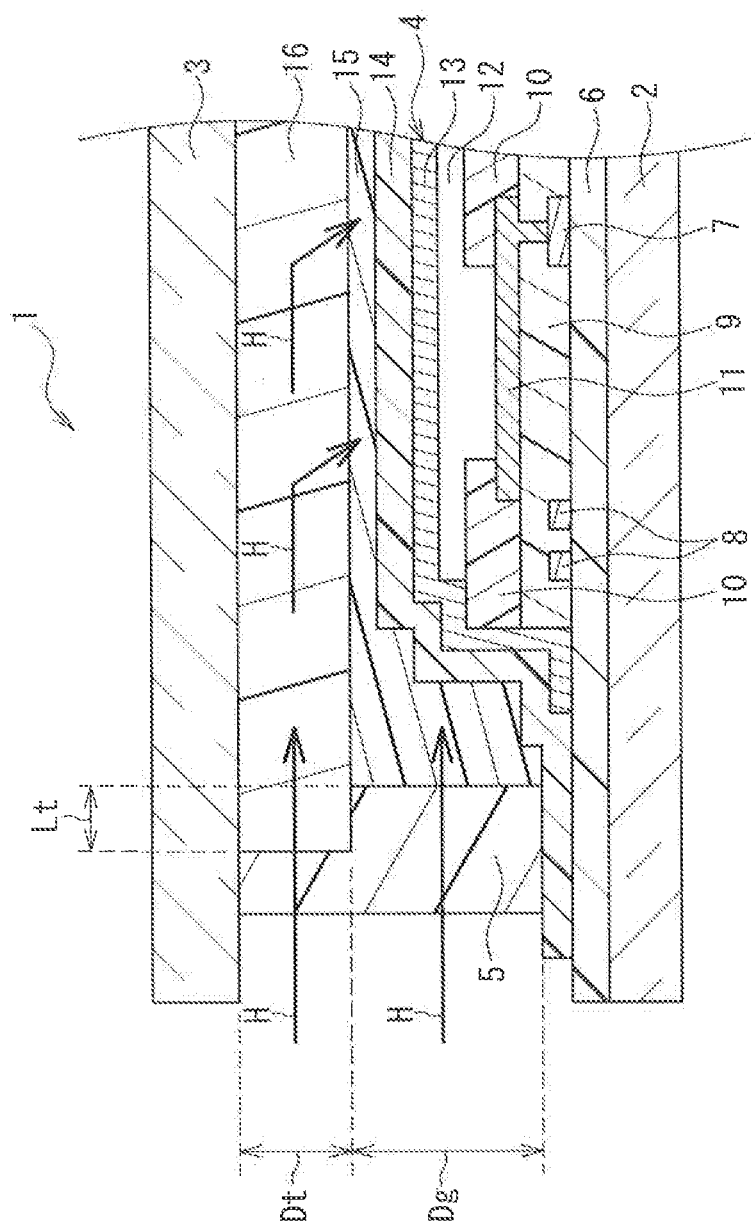
FIG. 3 is an enlarged cross-sectional view for illustrating principal components of the above-described organic EL display device.

Here, the principal components of the organic EL display device 1 of the present embodiment will be specified with reference to FIG. 3.

FIG. 3 is an enlarged cross-sectional view for illustrating the principal components of the above-described organic EL display device.

As shown in FIG. 3, in the organic EL display device 1 of the present embodiment, the highly-moisture-permeable layer 16 is configured to get into the sealing resin 5 by a length Lt. Specifically, when the width of the sealing resin 5 (in FIG. 3, the transverse dimension of the part of the sealing resin 5 in contact with the desiccant layer 15) is 800 μm for example, the length Lt of the highly-moisture-permeable layer 16 is set to a range of 50 to 400 μm for example.

When the thickness of the highly-moisture-permeable layer 16 (the dimension in the thickness direction (vertical direction in FIG. 3) of the organic EL display device 1) is set to Dt and the peripheral length of the inner surface of the frame-like sealing resin 5 is set to Ls, a contact area S1 of the highly-moisture-permeable layer 16 with the sealing resin 5 is expressed by Equation (1) below.

$$S1=(Dt+Lt)\times Ls \quad (1)$$

When the thickness of the desiccant layer 15 is set to Dg, a contact area S2 of the desiccant layer 15 with the sealing resin 5 is expressed by Equation (2) below.

$$S2=Dg\times Ls \quad (2)$$

Therefore, a contact area ratio Sr of the contact area S1 of the highly-moisture-permeable layer 16 with respect to the contact area S2 of the desiccant layer 15 is expressed by Equation (3) below.

$$Sr=(Dt+Lt)/Dg \quad (3)$$

In the organic EL display device 1 of the present embodiment, preferably the contact area ratio Sr is set to 1 or more. Specifically, Dt, Lt and Dg are set to 2 μm, 100 μm and 8 μm respectively for example. The contact area ratio Sr is set to 12.8 (=102/8). By setting such a contact area ratio Sr, in the organic EL display device 1 of the present embodiment, moisture that has permeated the sealing resin 5 can be absorbed surely by the desiccant layer 15 while partial moisture absorption at the desiccant layer 15 is prevented.

That is, as indicated with arrows H in FIG. 3, the entering moisture is taken into either the desiccant layer 15 or the highly-moisture-permeable layer 16. The moisture taken into the desiccant layer 15 is trapped (absorbed) by a trapping (absorbing) material included in the desiccant layer 15. On the other hand, the moisture taken into the highly-moisture-permeable layer 16 diffuses within the highly-moisture-permeable layer 16, and taken into the desiccant layer 15 at the time of a re-diffusion in the desiccant layer 15.

Further, the amount of moisture to be directly taken into the desiccant layer 15 and the amount of moisture to be taken into the highly-moisture-permeable layer 16 rely considerably on the contact area S1 or S2 between any of these layers and the sealing resin 5. Therefore, as described above, most of the moisture can be taken into the highly-moisture-permeable layer 16 by setting the contact area ratio Sr to be 1 or more.

When the length Lt of the highly-moisture-permeable layer 16 getting into the sealing resin 5 is longer, the contact area ratio Sr of the highly-moisture-permeable layer 16 and the desiccant layer 15 with respect to the sealing resin 5 is increased. This is effective because the percentage of moisture to be taken into the highly-moisture-permeable layer 16 is increased. However, when the length Lt of the highly-moisture-permeable layer 16 is longer, the width of the sealing resin 5 at the part is decreased, and thus the amount of the entering moisture is increased. Therefore, the length Lt of the highly-moisture-permeable layer 16 is preferably in a range of 50 to 400 μm as described above.

Next, a method for producing the organic EL display device 1 of the present embodiment will be explained specifically with reference to FIG. 4.

Figure 4:
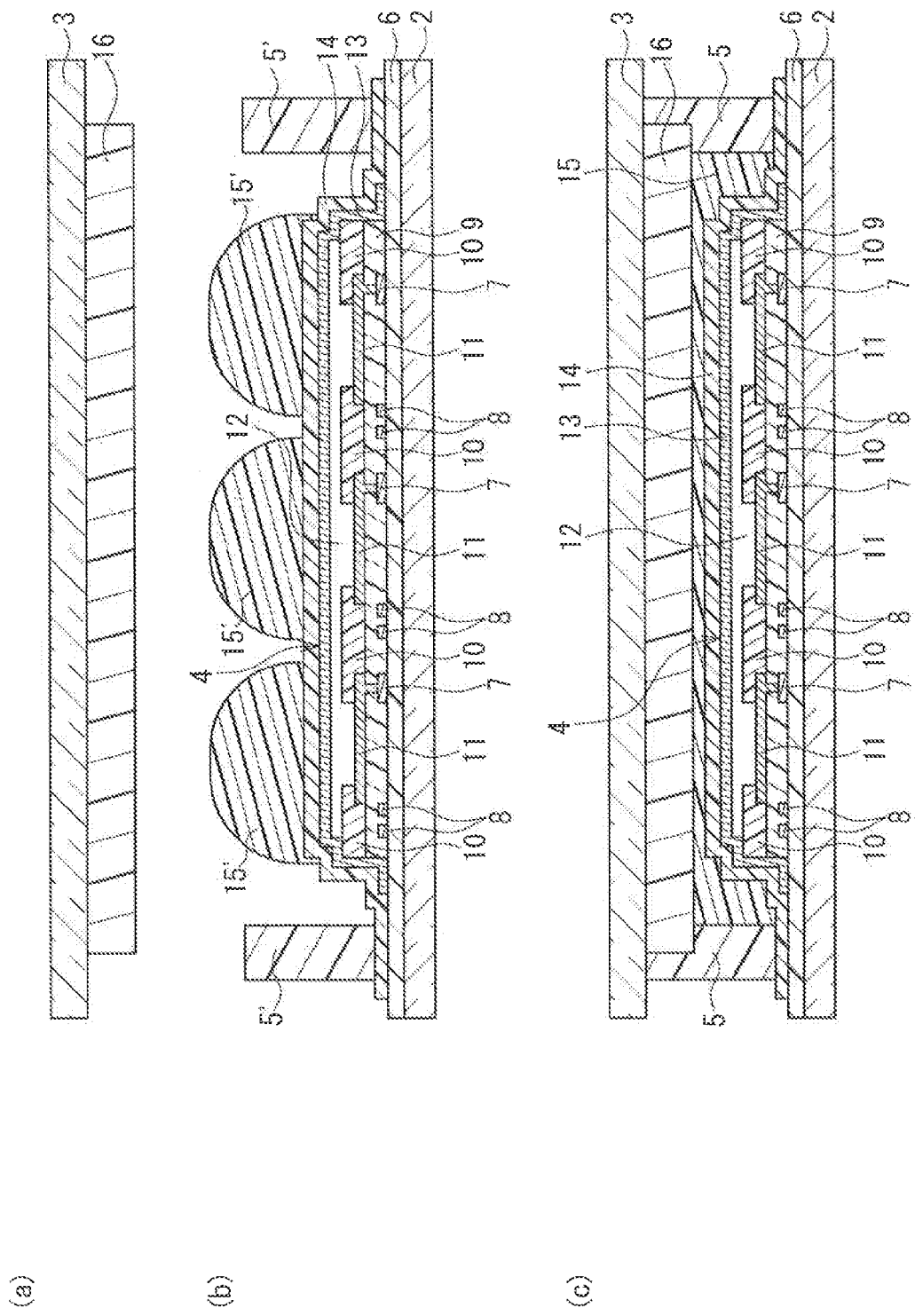
FIG. 4 includes diagrams for illustrating principal steps for producing the above-described organic EL display device.

FIG. 4 includes diagrams for illustrating principal steps for producing the organic EL display device, and FIGS. 4(a)-4(c) illustrate a series of principal steps for production.

As shown in FIG. 4(a), the highly-moisture-permeable layer 16 is pattern-formed on a surface of the counter substrate 3 so as to face the TFT substrate 2. Specifically, the highly-moisture-permeable layer 16 is provided on the surface of the counter substrate 3 by using for example printing, photolithography, vacuum evaporation, sputtering, plasma polymerization and the like.

Furthermore, as shown in FIG. 4(b), on the TFT substrate 2 side, a sealing resin 5' is applied in a form of frame (ring) to surround the pixel region A (FIG. 1) by nozzle-dispensing for example. Sequentially, as exemplified in FIG. 4(b), three desiccant layers 15' are dropped and applied on the protective film 14. This dropping amount is determined in accordance with the encapsulation volume of the desiccant layer 15. Further, for application of the sealing resin 5' and the desiccant layers 15', for example a one drop fill process (ODF process) can be used.

Next, as shown in FIG. 4(*c*), the TFT substrate 2 and the counter substrate 3 are bonded to each other in a vacuum state. At that time, the sealing resin 5 is brought into intimate contact with the counter substrate 3 such that the highly-moisture-permeable layer 16 gets into the sealing resin 5 (i.e., the width of the top of the sealing resin 5 becomes smaller than the width of the bottom due to the highly-moisture-permeable layer 16, so that a frame-like notch is formed on the top of the sealing resin 5 for engagement with the highly-moisture-permeable layer 16). At the same time, the desiccant layer 15 is spread so as to be filled without clearance in the encapsulation region (i.e., a region of space surrounded by the protective film 14 (organic EL element 4), the sealing resin 5 and the highly-moisture-permeable layer 16). Later, the sealing resin 5 is cured by UV exposure and calcination. In this manner, the organic EL display device 1 of the present embodiment is completed.

Alternatively, it is also possible to form the desiccant layer 15 by using vacuum evaporation, for example. However, the above-described method of using the ODF process is preferred, since the production cost can be suppressed even in a case of forming a desiccant layer 15 having a minimum thickness of 5 μm or more for example.

In the thus configured organic EL display device 1 of the present embodiment, the organic EL element (electroluminescent element) 4 is encapsulated by the TFT substrate (substrate) 2, the counter substrate 3 and the sealing resin 5. On the organic EL element 4, the desiccant layer 15 and the highly-moisture-permeable layer 16 are laminated in this order. The highly-moisture-permeable layer 16 is in direct contact with the sealing resin 5. Thereby, in the present embodiment, unlike the above-described conventional example, it is possible to form an organic EL display device 1 where moisture can be absorbed surely by the desiccant layer 15 while partial moisture absorption is prevented. That is, in the organic EL display device 1 of the present embodiment, moisture that has permeated the sealing resin 5 can be diffused in the entire desiccant layer 15 by the highly-moisture-permeable layer 16, thereby partial moisture absorption in the desiccant layer 15 can be prevented. Further in the organic EL display device of the present embodiment, unlike the above-described conventional example, it is possible to increase easily the thickness of the desiccant layer 15, thereby improving easily the moisture absorption performance of the desiccant layer 15. In the organic EL display device 1 of the present embodiment, even when the moisture that has permeated the sealing resin 5 does not diffuse in the highly-moisture-permeable layer 16, the moisture can be absorbed surely by the desiccant layer 15. In the organic EL display device 1 of the present embodiment, even when the moisture that has diffused into the highly-moisture-permeable layer 16 diffuses toward the organic EL element 4 side, the moisture passes necessarily through the desiccant layer 15, and as a result, the moisture can be absorbed surely by the desiccant layer 15.

As a result, in the present embodiment, it is possible to prevent damage to the luminescence property caused by moisture entering the pixels in the vicinity of the periphery, and partial cure-shrinkage of the desiccant layer 15 in the vicinity of the periphery. Further, it is possible to prevent cracks in the desiccant layer 15 caused by the above-described partial cure shrinkage, and thus, it is possible to prevent deterioration in optical properties (for example, degradation in transmissivity of the desiccant layer 15 and occurrence of scattering in the top-emission structure) and occurrence of physical damage to pixels caused by cracks extending to the pixels. Therefore, in the present embodiment, it is possible to configure easily an organic EL display device 1 that has excellent display image quality and high reliability.

Further in the present embodiment, the desiccant layer 15 is provided to fill the space surrounded by the protective layer 14 (organic EL element 4), the sealing resin 5, and the highly-moisture-permeable layer 16. Thereby, in the present embodiment, the moisture absorption performance of the desiccant layer 15 can be improved more easily.

In the present embodiment, the highly-moisture-permeable layer 16 is provided to get into the sealing resin 5. Thereby, in the present embodiment, moisture can diffuse more into the highly-moisture-permeable layer 16, and thus, it is possible to prevent more surely occurrence of partial moisture absorption in the desiccant layer 15.

In the present embodiment, since the highly-moisture-permeable layer 16 is composed of a resin material, the highly-moisture-permeable layer 16 can be provided easily.

In the present embodiment, since the moisture permeation rate of the highly-moisture-permeable layer 16 is greater than the moisture permeation rate of the sealing resin 5, moisture that has permeated the sealing resin 5 diffuses rapidly by the highly-moisture-permeable layer 16 without retaining at the interface between the sealing resin 5 and the highly-moisture-permeable layer 16. That is, if moisture retains at the interface, the moisture will be taken easily by the desiccant layer 15 in the vicinity of the periphery, and as a result, moisture absorption amount in the desiccant layer 15 may increase partially in the vicinity of the periphery. However, according to the present embodiment, it is possible to prevent such a partial increase in moisture absorption amount of the desiccant layer 15.

In addition to the foregoing description, the desiccant layer 15 may include any oxygen-absorptive material such as metallic particles of iron, aluminum and the like for example, and any organic substance that is oxidized easily.

[Second Embodiment]

FIG. 5 is a cross-sectional view illustrating an organic EL display device according to Second Embodiment of the present invention.

In the drawing, the present embodiment is differentiated from the above-described First Embodiment mainly in that a black matrix layer and color filter layers are used as the highly-moisture-permeable layer. Here, components substantially identical to those of the above-described First Embodiment are assigned with the same reference numbers in order to avoid a duplicated explanation.

That is, as shown in FIG. 5, in the organic EL display device 1 of the present embodiment, a mixture layer including a black matrix layer 17BM, a red color filter layer 17R, a green color filter layer 17G and a blue color filter layer 17B are used as the highly-moisture-permeable layer.

In the organic EL display device 1 of the present embodiment, the black matrix layer 17BM is provided at the edge so as to get into the sealing resin 5. Thereby, similarly to the case of First Embodiment, most of the moisture that has permeated the sealing resin 5 will be taken into the black matrix layer 17BM.

For the black matrix layer 17BM, for example, a photosensitive acrylic resin containing carbon black particles is used. For the color filter layers 17R, 17G and 17B, for example, photosensitive acrylic resins containing pigment particles of any corresponding colors are used. Specific thickness of the black matrix layer 17BM, the color filter layers 17R, 17G and 17B is 2 μm for example.

In the organic EL display device 1 of the present embodiment, the organic EL element 4 is configured to emit white light at all of the pixels. Thereby, in the present embodiment, an organic EL element 4 having a simple configuration can be provided. As a result, it is possible to configure an organic EL display device 1 that can be produced easily at a low cost and that can easily have a large size.

Other than this explanation, similarly to the case of First Embodiment, the organic EL element 4 can be configured to emit light of any of colors of RGB. In this case, the pixels of RGB of the organic EL element 4 are provided respectively below one of the color filter layers 17R, 17G and 17B of the corresponding colors. Thereby, it is possible to improve the color purity of the respective colors, and an organic EL display device 1 of high quality can be configured easily.

With the above-described configuration, the present embodiment achieves the effects similar to those of First Embodiment described above. Since the black matrix layer 17BM and the color filter layers 17R, 17G and 17B are used as the highly-moisture-permeable layer in the present embodiment, it is possible to configure easily an organic EL display device 1 that is capable of full color display even when the organic EL element 4 emits white light.

[Third Embodiment]

Figure 6:
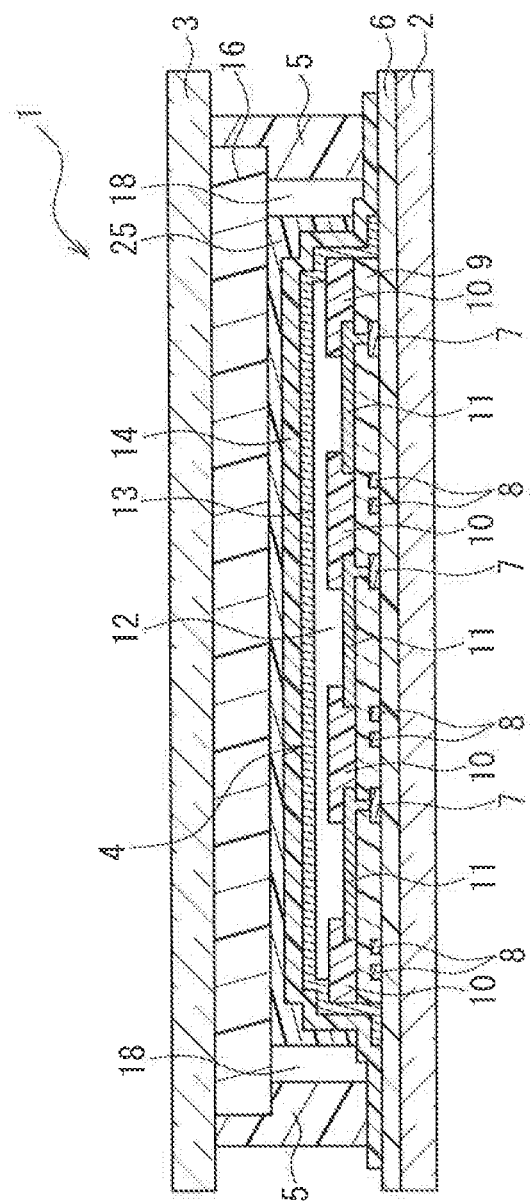
FIG. 6 is a cross-sectional view for illustrating an organic EL display device according to Third Embodiment of the present invention.
Figure 7:
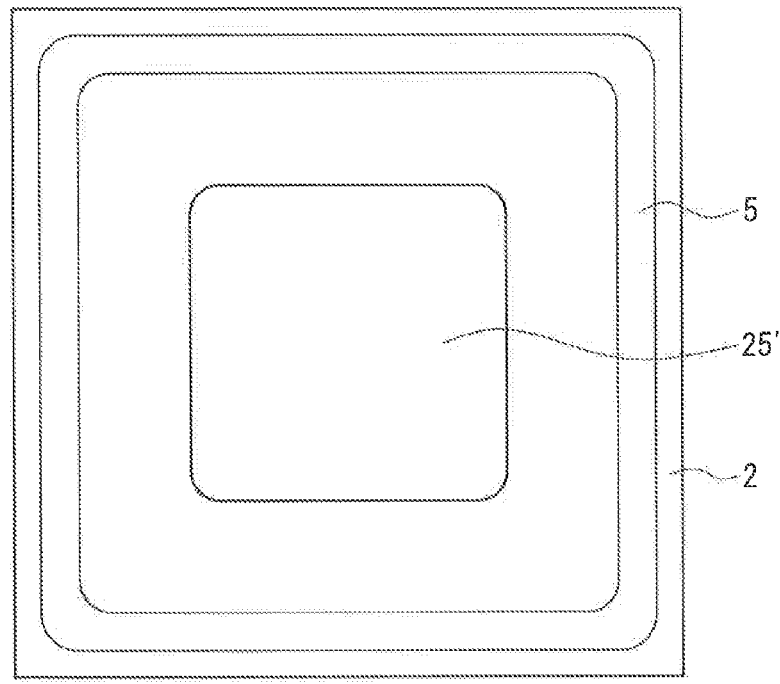
FIG. 7(a) is a diagram for illustrating a specific example of dropping application of a desiccant layer as shown in FIG. 6.
FIG. 7(b) is a diagram for illustrating another specific example of dropping application of a desiccant layer as shown in FIG. 6.
Figure 7:
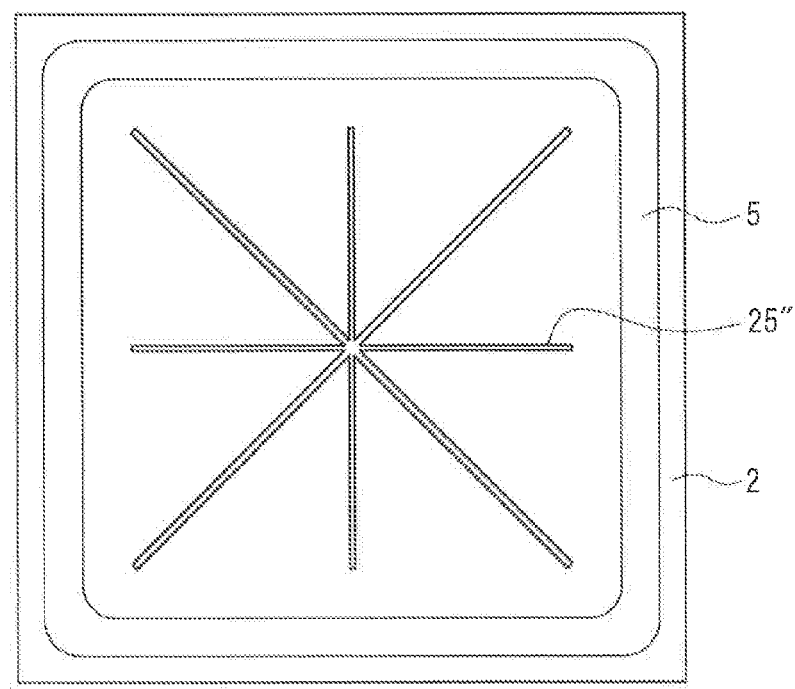
Figure 8:
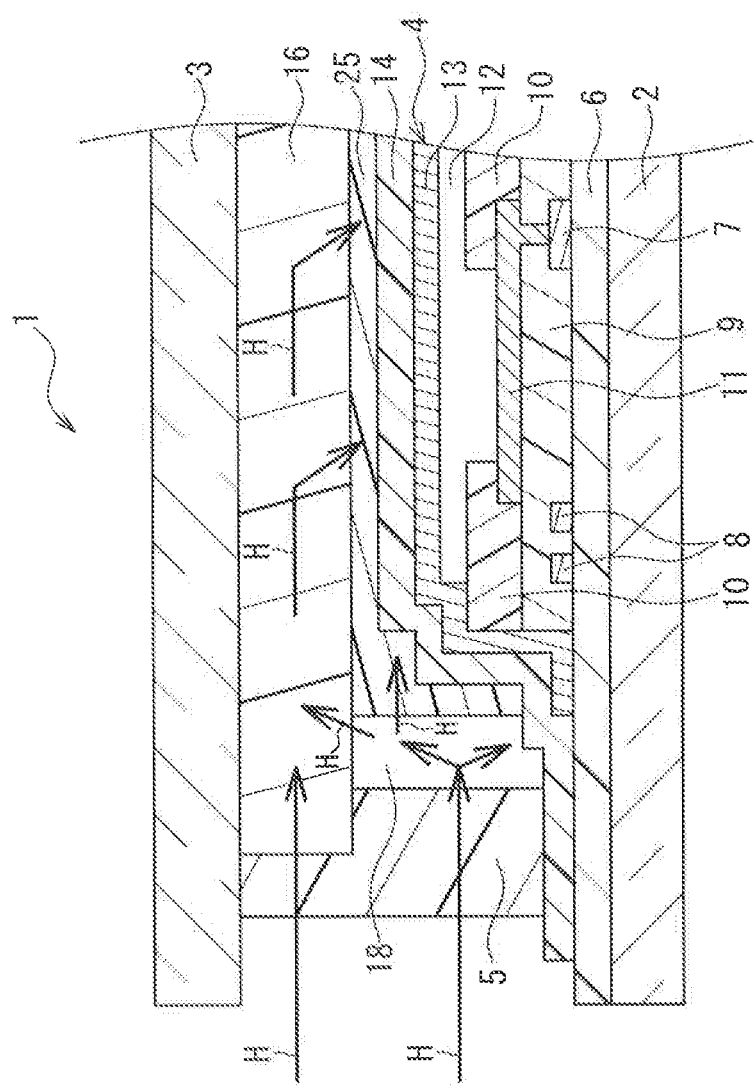
FIG. 8 is an enlarged cross-sectional view for illustrating principal components of the organic EL display device as shown in FIG. 6.
Figure 9:
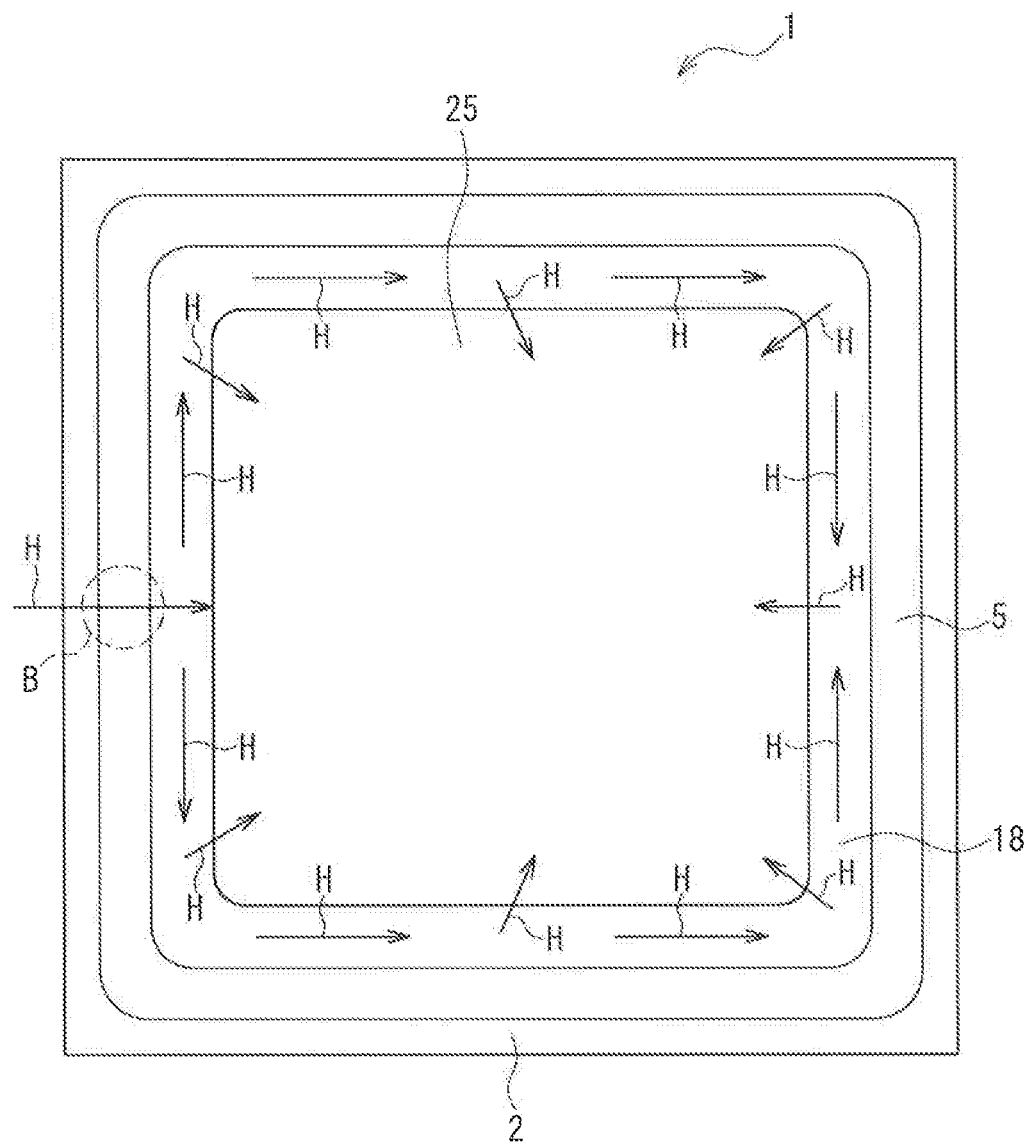
FIG. 9 is a diagram for illustrating a specific effect provided by the hollow region as shown in FIG. 6.

FIG. 6 is a cross-sectional view illustrating an organic EL display device according to Third Embodiment of the present invention. FIG. 7(a) is a diagram illustrating a specific example of dropping application of the desiccant layer as shown in FIG. 6, and FIG. 7(b) is a diagram illustrating another specific example of dropping application of the desiccant layer as shown in FIG. 6. FIG. 8 is an enlarged cross-sectional view illustrating principal components of the organic EL display device as shown in FIG. 6. FIG. 9 is a diagram illustrating a specific effect provided by the hollow region as shown in FIG. 6.

In the drawing, the present embodiment is differentiated from the above-described First Embodiment mainly in that a hollow region is formed between the sealing resin and the desiccant layer. Here, components substantially identical to those of the above-described First Embodiment are assigned with the same reference numbers in order to avoid a duplicated explanation.

That is, in the organic EL display device 1 of the present embodiment in FIG. 6, a frame-like hollow region 18 is formed between the sealing resin 5 and a desiccant layer 25. This hollow region 18 is set to be a low-pressure state of not more than 1 Pa or filled with an inactive gas.

As shown in FIG. 7(a), before bonding the TFT substrate 2 and the counter substrate 3, the dropping amount of a desiccant layer 25' is adjusted to be dropped and applied concentratedly onto the center of the TFT substrate 2, thereby forming the hollow region 18. Alternatively, as shown in FIG. 7(b), before bonding the TFT substrate 2 and the counter substrate 3, the dropping amount of a desiccant layer 25" is adjusted to be dropped and applied radially onto the TFT substrate 2, thereby forming the hollow region 18.

Specifically, as exemplified in FIG. 7(a) or FIG. 7(b), the dropping amount and the application pattern of the desiccant layer 25' or 25" are controlled and adjusted appropriately, so that a clearance (i.e., the hollowing region 18) is formed between the desiccant layer 25' or 25" and the sealing resin 5 even if the desiccant layer is pressed and spread into the encapsulated region at the time of bonding the TFT substrate 2 and the counter substrate 3.

In particular, in a case of filling the hollow region 18 with an inactive gas, the desiccant layer 25' or 25" is dropped to prevent the gas from remaining as bubbles in the pixels. Next, at the time of bonding the TFT substrate 2 and the counter substrate 3 (after bringing the sealing resin 5 into intimate contact with the counter substrate 3), the TFT substrate 2 and the counter substrate 3 are applied with pressure, so that the desiccant layer 25' or 25" is spread toward the periphery within the encapsulated region. At that time, the pressure of the inactive gas is increased with the decrease of the hollow region 18, and at the point where the pressure is equalized with the pressure for spreading the desiccant layer 25' or 25", the desiccant layer 25' or 25" can be stopped from spreading. Therefore, by adjusting the dropping-application pattern of the desiccant layer 25' or 25" and by adjusting appropriately the pressure of the inactive gas, it is possible to form the desiccant layer 25' or 25" only in a desired region, and to form the hollow region 18.

In a case of making the hollow region 18 vacuum, the TFT substrate 2 and the counter substrate 3 are bonded to each other while keeping vacuum of not more than 1 Pa.

As indicated with arrows H in FIG. 8, in the organic EL display device 1 of the present embodiment, moisture that has permeated the sealing resin 5 from exterior is directly taken into the highly-moisture-permeable layer 16 or it enters and diffuses into the hollow region 18 before being taken into the highly-moisture-permeable layer 16 or the desiccant layer 25. Moisture that has been taken into the highly-moisture-permeable layer 16 diffuses in the highly-moisture-permeable layer 16, and then goes out towards the desiccant layer 25 so as to be trapped (absorbed) by the desiccant layer 25.

As indicated with arrows H in FIG. 9, in the organic EL display device 1 of the present embodiment, a part of moisture, which has permeated the sealing resin 5 but has not been taken directly into the highly-moisture-permeable layer 16, gets into the hollow region 18 and diffuses there.

Assumed that the sealing resin 5 had a part with inferior moisture-proof performance (for example, indicated as "B" in FIG. 9), which is caused by any defect due to foreign objects or depletion, inferior coatability of the TFT substrate 2 or the counter substrate 3 with regard to disparity, and influence of surface conditions (materials, wettability etc.) of the TFT substrate 2 or the counter substrate 3, the amount of moisture to pass through the part would be increased. In such a case, if the hollow region 18 does not exist, the moisture would be taken into either the highly-moisture-permeable layer 16 or the desiccant layer 25. However, if the moisture enters faster than the moisture permeation rate of the highly-moisture-permeable layer 16, the moisture would retain and be accumulated at the highly-moisture-permeable layer 16, and the moisture permeation amount at the desiccant layer 25 being in contact with the highly-moisture-permeable layer would increase partially. This would cause saturation in moisture permeation amount, infiltration of moisture into the pixels, and/or cracks of the desiccant layer 25, and it also would cause deterioration in the display quality.

In contrast, since the organic EL display device 1 of the present embodiment has the hollow region 18, moisture can diffuse into also the hollow region 18. Later, the moisture is taken into ether the highly-moisture-permeable layer 16 or the desiccant layer 25. That is, since the moisture diffuses into the entire hollow region 18, even when the sealing resin 5 has a part with inferior moisture-proof performance as exemplified as "B" in FIG. 9, it is possible to accelerate moisture absorption in the entire desiccant layer 25 without causing partial moisture absorption of the desiccant layer 25 in the vicinity of the part with inferior moisture-proof performance. Therefore, even when there is a part with inferior moisture-proof performance in the sealing resin 5, it is possible to prevent degradation of display quality in the organic EL display device 1 of the present embodiment without causing deterioration in luminescence property, deterioration in optical properties or physical damage to the pixels.

When the hollow region 18 is larger, the performance to diffuse moisture is enhanced. However, when the width of the hollow region 18 (the distance between the desiccant layer 25 and the sealing resin 5) is increased, the non-pixel region (frame-region) of the organic EL display device 1 is enlarged, which could affect the product design. Therefore, the width of the hollow region 18 may be designed in a permissible range for the moisture diffusion performance. Specifically, the width of the hollow region 18 is 50 μm to 1000 μm for example, and typically about 300 μm.

With the above-described configuration, the present embodiment achieves the effects similar to those of First Embodiment described above. In addition to that, in the present embodiment, the hollow region 18 is formed between the sealing resin 5 and the desiccant layer 25. As a result, in the present embodiment, the hollow region 18 serves to prevent more surely partial moisture absorption at the desiccant layer 25, and at the same time it serves to direct more moisture to the highly-moisture-permeable layer 16.

Further in the present embodiment, the hollow region 18 is set to be in a low-pressure state of not more than 1 Pa or filled with an inactive gas. Thereby in the present embodiment, it is possible to provide more appropriately the desiccant layer 25 and the hollow region 18.

The above-described embodiments are merely illustrative and not limiting. The technical scope of the present invention is specified by the scope of the claims, and any modification falling in the scope of the configuration described therein and equivalent thereto also fall in the technical scope of the present invention.

For example, the foregoing description refers to a case where the present invention is applied to use of an organic EL element as an electroluminescent element, but the electroluminescent element of the present invention is not limited to this; it may be applied also to an inorganic EL element having an inorganic compound, for example.

Further, the foregoing description refers to a case where the present invention is applied to an organic EL display device, but the present invention is not limited to this; it may be applied also to a lighting apparatus such as a backlight apparatus.

In addition to the above explanations, it is also possible to combine suitably the above-described First to Third Embodiments.

INDUSTRIAL APPLICABILITY

The present invention is useful for an electroluminescent device that can make moisture be absorbed surely by a desiccant layer while preventing partial moisture absorption.

EXPLANATION OF LETTERS AND NUMERALS 1 organic EL display device
2 TFT substrate (substrate)
3 counter substrate
4 organic EL element (electroluminescent element)
5 sealing resin
15,25 desiccant layer
16 highly-moisture-permeable layer
17BM black matrix layer (highly-moisture-permeable layer)
17R,17G,17B color filter layer (highly-moisture-permeable layer)
18 hollow region

The invention claimed is:

1. An electroluminescent device comprising:
a substrate; and
an electroluminescent element provided on the substrate, wherein
the electroluminescent element is encapsulated by the substrate, a counter substrate provided opposed to the substrate, and a sealing resin between the substrate and the counter substrate,
a desiccant layer and a highly-moisture-permeable layer are laminated in this order on the electroluminescent element,
the highly-moisture-permeable layer is in direct contact with the sealing resin,
a hollow region is between the sealing resin and the desiccant layer,
the desiccant layer faces the sealing resin through the hollow region so that the desiccant layer is not in direct contact with the sealing resin,
a protective film is between the electroluminescent element and the desiccant layer, and the protective film extends beyond the sealing resin,
a portion where the protective film and the sealing resin overlap overlaps with the highly-moisture-permeable layer, and
another portion where the protective film and the sealing resin overlap does not overlap with the highly-moisture-permeable layer.

2. The electroluminescent device according to claim 1, wherein the desiccant layer is provided to fill a space surrounded by the electroluminescent element, the sealing resin and the highly-moisture-permeable layer.

3. The electroluminescent device according to claim 1, wherein the hollow region is set to have a low pressure of not more than 1 Pa, or to be filled with an inactive gas.

4. The electroluminescent device according to claim 1, wherein the highly-moisture-permeable layer is provided to get into the sealing resin.

5. The electroluminescent device according to claim 1, wherein the highly-moisture-permeable layer is composed of a resin material.

6. The electroluminescent device according to claim 1, wherein the highly-moisture-permeable layer has a moisture permeation rate greater than a moisture permeation rate of the sealing resin.

7. The electroluminescent device according to claim 1, wherein a width of the hollow region is 50 μm to 1000 μm.

8. The electroluminescent device according to claim 1, wherein
an underlying film is provided on the substrate to cover an entire surface of the substrate,
the electroluminescent element is formed on the underlying film, and
the underlying film extends beyond the sealing resin.

9. The electroluminescent device according to claim 8, wherein a protective film is provided between the electroluminescent element and the desiccant layer so that the protective film extends beyond the sealing resin, and a portion of the underlying film is not covered by the protective film at an end portion of the substrate.

* * * * *